United States Patent
Kim et al.

Patent Number: 6,060,399
Date of Patent: May 9, 2000

[54] METHOD FOR ISOLATING SEMICONDUCTOR DEVICES

[75] Inventors: Young-Gwan Kim, Cheongju; Joon-Sung Lee, Sungnam, both of Rep. of Korea

[73] Assignee: LG Semicon Co., Ltd., Choongcheongbuk-do, Rep. of Korea

[21] Appl. No.: 08/923,108

[22] Filed: Sep. 4, 1997

[30] Foreign Application Priority Data

Mar. 18, 1997 [KR] Rep. of Korea .......... 97-9087

[51] Int. Cl.$^7$ .................................. H01L 21/30
[52] U.S. Cl. ................ 438/706; 438/710; 438/719
[58] Field of Search ..................... 438/691, 692, 438/698, 697, 700, 701, 710, 702, 706, 719

[56] References Cited

U.S. PATENT DOCUMENTS

| | | | |
|---|---|---|---|
| 4,857,477 | 8/1989 | Kanamori | 437/47 |
| 5,258,332 | 11/1993 | Horioka et al. | 437/228 |
| 5,674,775 | 10/1997 | Ho et al. | 438/698 |
| 5,726,090 | 3/1998 | Jang et al. | 438/435 |
| 5,731,241 | 3/1998 | Jang et al. | 438/424 |
| 5,801,083 | 9/1998 | Yu et al. | 438/424 |

OTHER PUBLICATIONS

A. Chatterjee et al., "A Shallow Trench Isolation Study for 0.25/0.18μm CMOS Technologies and Beyond", 1996 Symposium on VLSI Technology Digest of Technical Papers, pp. 158–157.

*Primary Examiner*—Benjamin L. Utech
*Assistant Examiner*—Kin-Chan Chen

[57] ABSTRACT

A semiconductor device isolation method includes sequentially forming a first insulating film and a second insulating film on a semiconductor substrate, exposing a predetermined portion of the surface of the semiconductor substrate, forming a third insulating on the exposed surface of the semiconductor substrate and the second insulating film, forming sidewall spacers composed of the third insulating film at the sidewall surfaces of the first and second insulating films, forming a trench by performing an etching by a predetermined depth using the sidewall spacers as a mask, removing the sidewall spacers, filling a high density plasma chemical vapor deposition (HDP CVD) oxide in the trench, and removing the first and second insulating films.

9 Claims, 4 Drawing Sheets

METHOD FOR ISOLATING SEMICONDUCTOR DEVICES

BACKGROUND OF THE INVENTION

1. Field of the Invention

The present invention relates to an isolation method for a semiconductor device, and more particularly, to a trench isolation method in which the concentration of an electric field can be prevented by forming an upper corner of a trench to be rounded and isolating the semiconductor devices by forming a trench in a semiconductor substrate.

2. Description of the Background Art

A local oxidation on silicon (LOCOS) is chiefly used as a conventional method for isolating semiconductor devices. However, the trench isolation method is receiving much attention, since the trench isolation structure does not encroach a channel width, the size of a device can be advantageously reduced. Also, such trench isolation structure can prevent latchup effects, and thus the characteristics of the semiconductor memory device can be improved, and in addition, the trench isolation method allows a uniform structure to be formed.

As shown in FIG. 1, according to the conventional trench isolation structure, a trench 5 is formed in a substrate 1, an upper portion of the trench 5 is not formed to be rounded, and a TEOS oxide 6 formed by a chemical vapor deposition (CVD) is filled in the trench 5. The TEOS oxide 6 has an upper surface formed in a double-hump structure.

In the above-described isolation method of a trench structure, first, an oxide film 2 and a nitride film 3 are sequentially formed on the semiconductor substrate 1, as shown in FIG. 2A, and a portion of the surface of the semiconductor substrate 1 is exposed by performing a partial etching on the nitride film 3 and the oxide film, as shown in FIG. 2B. Then, as shown in FIG. 2C, the trench 5 is formed by etching the exposed semiconductor substrate 1 to a predetermined depth, and as shown in FIG. 2D, the trench 5 is filled with the oxide 6 about up to a level of the nitride film 3. Finally, the nitride film 3 and the oxide film 2 are removed.

However, in the conventional trench isolation structure, since the upper corner of the trench 5 is not formed to be rounded, an electric field is concentrated at the corner which deteriorates the characteristic of the device. Also, since a double hump occurs in that the portion where the trench-filling oxide 6 is in contact with the upper corner is sunken, when the patterning is carried out after polysilicon (not illustrated) for a gate electrode is deposited in the trench 5, the sunken portion of the double hump structure formed in the trench 5 is filled with polysilicon. Thereby, a bridge is formed instead of a gate electrode (not illustrated), and as a result, the device is not operational.

Accordingly, to solve the above-described problem, recently, a method for rounding the corners of the trench has been considered, and one example of a trench isolation method was disclosed in 1996 Symposium on VLSI Technology Digest of Technical Papers p.156–157.

That is, a twin well is formed by a general diffusion on a p-type silicon substrate which has 5–15 Ω/cm epitaxial resistance and a thickness of 3.5–6 μm, and then a pad oxide film is formed to have a thickness of 100–150 Å on the semiconductor substrate. Then, a nitride film is formed to have a thickness of 1500–2000 Å on the pad oxide film, and an active region and a non-active region are defined by a general photolithography process on the nitride film. Then a shallow trench etching is carried out as deep as 0.5 μm on the non-active region. Next, the semiconductor substrate is thermally oxidized with 5% HCl at a temperature of 900° C. to form a thermal oxide film having a thickness of 200 Å. Then 9000 Å of a high density plasma chemical vapor deposition (HDP CVD) oxide film is deposited on the thermal oxide film in the trench, and a chemical mechanical polishing (CMP) is carried out on the entire surface of the semiconductor substrate to remove the nitride film. Then, the pad oxide film is eliminated, and a gate oxide film is formed. Using the gate oxide as a mask, an impurity implantation is performed to form a source and a drain.

However, according to the this disclosed shallow trench isolation method, when the corner of the trench is rounded, the oxidation process must be carried out under a HCl atmosphere, but the HCl gas is a material hazardous to the environment.

SUMMARY OF THE INVENTION

Accordingly, it is an object of the present invention to provide an improved trench isolation method in which the corner of a trench is rounded without carrying out an oxidation process under an HCl gas atmosphere which is a material harmful to the environment.

To achieve the above object, there is provided an improved trench isolation method which includes sequentially forming a first insulating film and a second insulating film on a semiconductor substrate, exposing a portion of the surface of the semiconductor substrate, forming sidewall spacers composed of the third insulating film on the sidewall of the first and second insulating films, forming a trench by etching the exposed semiconductor substrate to a predetermined depth using the sidewall spacers as a mask, removing the sidewall spacers, filling a high density plasma chemical vapor deposition (HDP CVD) oxide in the trench, and removing the first and second insulating films.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The trench isolation method according to the present invention will now be described in detail with reference to the accompanying drawings.

Figure 1:
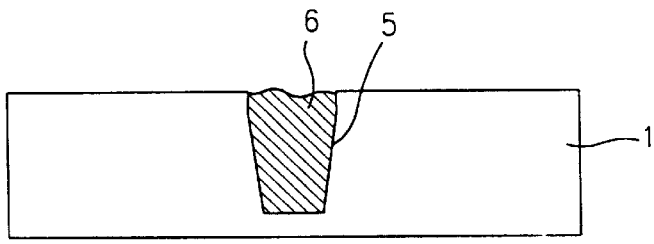
FIG. 1 is a cross-sectional view of a trench isolation structure according to the conventional art.
Figure 2A:
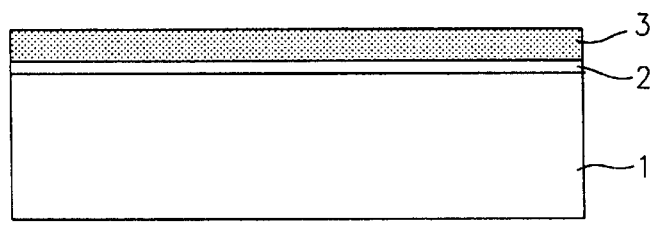
FIGS. 2A, 2B, 2C, and 2D are views showing the process of fabricating the conventional trench isolation structure.
Figure 2B:
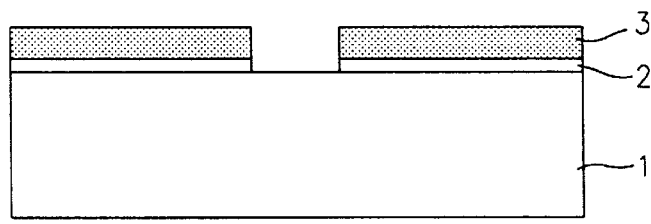
Figure 2C:
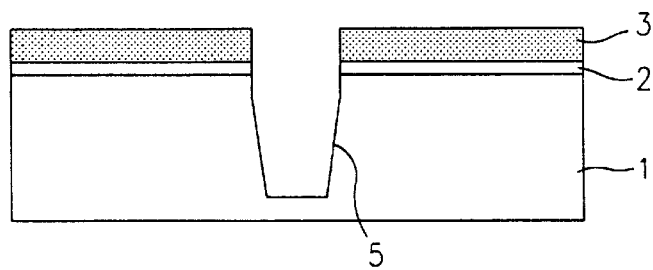
Figure 2D:
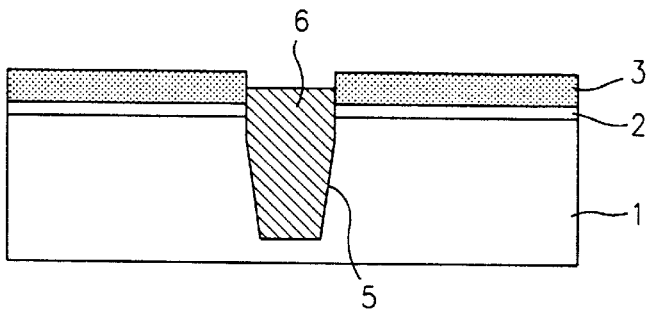
Figure 3:
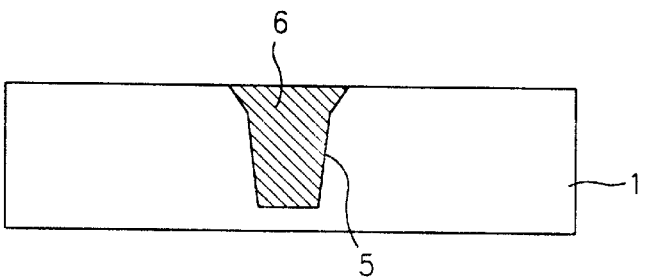
FIG. 3 is a cross-sectional view of a trench isolation structure according to the present invention.

First, as shown in FIG. 3, according to the trench isolation structure of the present invention, an opened upper corner trench is formed in a semiconductor substrate, and the trench is filled with an oxide formed by a high density plasma chemical vapor deposition (HDP CVD). The resultant upper surface is smoothly formed without a double hump structure.

The above-described trench isolation is formed by the following method.

Figure 4A:
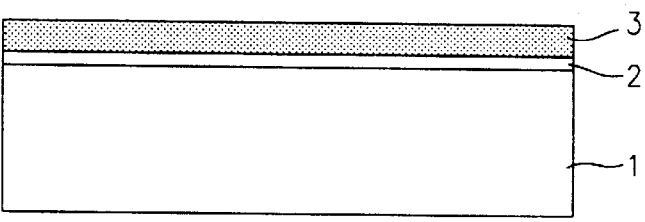
FIGS. 4A, 4B, 4C, 4D, 4E, 4F, 4G, 4H, and 4I are views showing the process of fabricating the trench isolation structure according to the present invention.
Figure 4B:
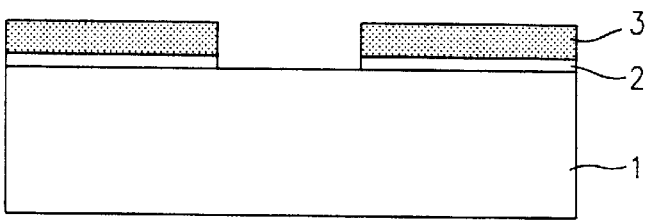
Figure 4C:
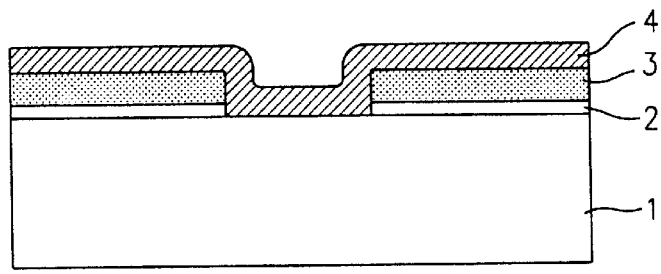
Figure 4D:
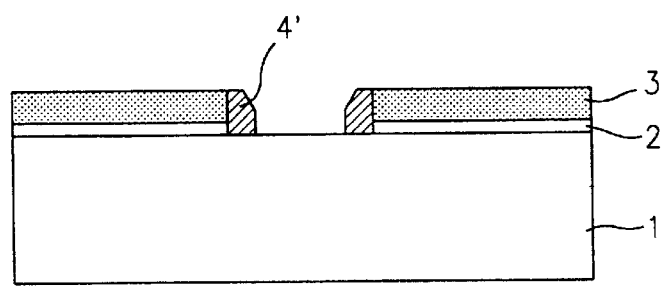
Figure 4E:
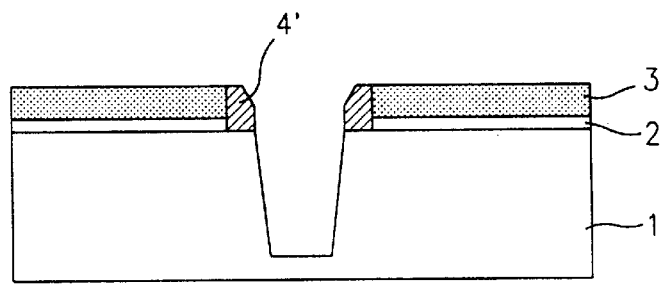
Figure 4F:
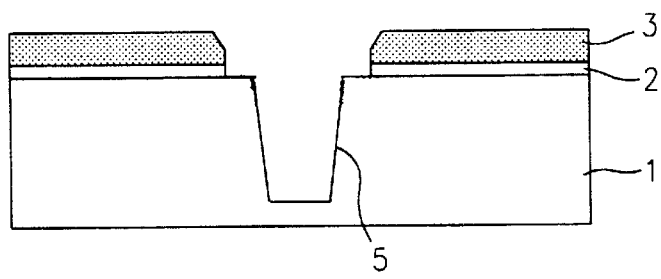
Figure 4G:
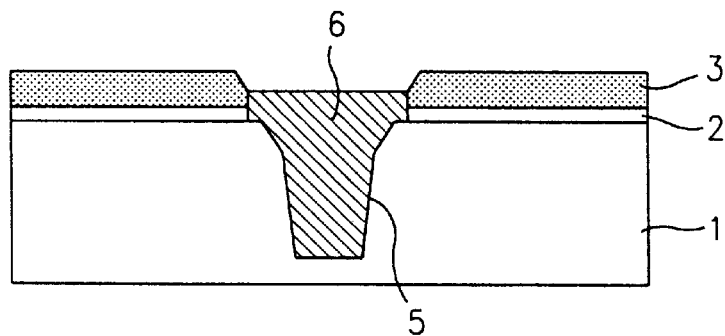
Figure 4H:
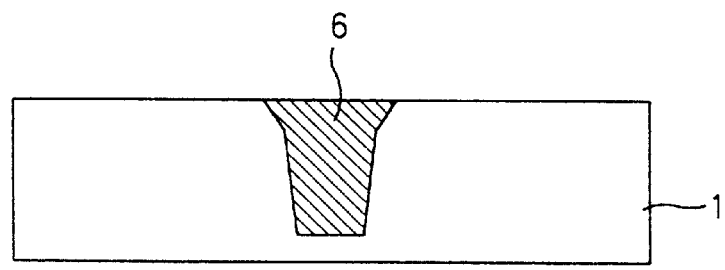
Figure 4I:
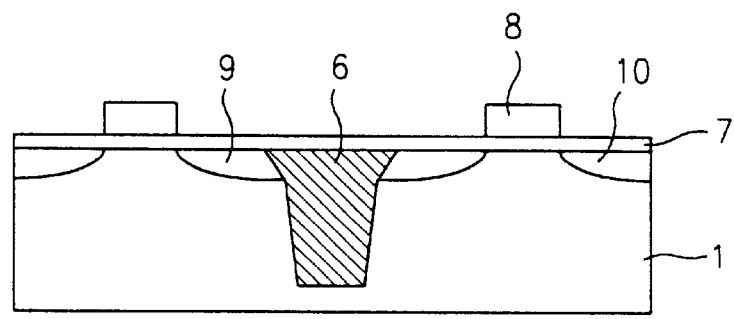

First, as shown in FIG. 4A, a pad oxide film 2 and a nitride film 3 are sequentially formed on the entire surface of a semiconductor substrate 1, and an active region and a non-active region are defined by a general photolithography. Then, as shown in FIG. 4B, the pad oxide film 2 and the nitride film 3 on the non-active region are etched to expose a portion of the surface of the semiconductor substrate 1. As shown in FIG. 4C, a material having an etching speed remarkably different from that of the nitride film is deposited on the exposed surface of the semiconductor substrate 1 and the nitride film 3 covering the other portions of the semiconductor substrate 1, so as to form an insulating film 4, for example, a film composed of silicon oxide. Then, by performing an anisotropic etching on the entire surface of the insulating film 4, as shown in FIG. 4D, side wall spacers 4' are formed at the etched side walls of the pad oxide film 2 and the nitride film 3. Then, a trench 5 shown in FIG. 4E is formed in the semiconductor substrate 1 by etching the semiconductor substrate 1, using as a mask the nitride film 3 and the side wall spacers 4' formed on the semiconductor substrate 1. Next, the side wall spacers 4' are removed to form the resultant shape shown in FIG. 4F. Then, as shown in FIG. 4G, an HDP oxide film 6 is formed on the semiconductor substrate and the trench 5 is filled with the HDP CVD oxide to reach a portion of the nitride film 3. Here, the upper corners of the trench 5 formed in the semiconductor substrate 1 are opened as a result of the formation of the HDP CVD oxide film 6. The reason is that the corners of the trench 5 are etched by a sputtering while the HDP CVD oxide film is deposited since deposition and sputtering are simultaneously performed while HDP CVD is being performed. In addition, before the trench 5 is filled with HDP CVD oxide, a buffering oxide film (not illustrated) can be formed in the trench 5. Then, a chemical mechanical polishing (CMP) or an etchback is carried out on the entire resultant surface of the semiconductor substrate 1 until the pad oxide film 2 is exposed and then the CMP process is performed until the pad oxide film 2 is removed, so as to planarize the surface of the semiconductor substrate 1. Therefore, the semiconductor substrate 1 has a planarized surface as shown in FIG. 4H, after the nitride film 3 and the pad oxide film 2 is removed. Then, as shown in FIG. 4I, a gate oxide film 7 is formed on the resultant surface of the semiconductor substrate 1, on which is formed a gate 8. Then a source 9 and a drain 10 are formed, using the gate 8 as a mask, for the completion of the fabrication of a semiconductor device having a trench isolation structure.

As described above, since no bird's beak as in the LOCOS occurs when employing the memory device isolation method of the present invention, the semiconductor device isolation region can be reduced to meet with a high integration trend. The latchup effects which is a main disadvantage of a CMOS device can be prevented, and the operational characteristic of the device is improved. Moreover, a trench which is capable of preventing the concentration of an electric field can be formed without using HCl gas.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A semiconductor device isolation method, comprising the steps of:

sequentially forming a first insulating film and a second insulating film on a semiconductor substrate;

removing a portion of the first and second insulating films to expose a portion of the surface of the semiconductor substrate;

forming sidewall spacers at sidewall surfaces of the first and second insulating films;

forming a trench by etching the exposed portion of the semiconductor substrate using the sidewall spacers as a mask;

removing the sidewall spacers;

filling the trench with an insulating material by a process in which deposition and etching are carried out simultaneously, so as to cause upper corners of the trench to be opened; and removing the first and second insulating films.

2. The method of claim 1, wherein the first insulating film is an oxide film and the second insulating film is a nitride film.

3. The method of claim 1, wherein the second insulating film has a high etch selectivity with respect to the sidewall spacers.

4. The method of claim 1, wherein the step of removing the first and second insulating films comprises planarizing the semiconductor substrate.

5. The method of claim 4, wherein the step of planarizing is performed by an etchback process.

6. The method of claim 4, wherein the step of planarizing is performed by a chemical mechanical polishing process.

7. The method of claim 1, wherein the step of filling the trench comprises filling the trench with the insulating material by a high density plasma chemical vapor deposition.

8. The method of claim 7, wherein the step of removing the first and second insulating films comprises planarizing the semiconductor substrate after the insulating material is formed in the trench by the high density plasma chemical vapor deposition.

9. The method of claim 8, wherein the insulating material is an oxide film.

* * * * *